US010910323B2

(12) United States Patent
Lin et al.

(10) Patent No.: US 10,910,323 B2
(45) Date of Patent: Feb. 2, 2021

(54) SEMICONDUCTOR PACKAGE WITH REDUCED NOISE

(71) Applicant: MEDIATEK INC., Hsin-Chu (TW)

(72) Inventors: Sheng-Mou Lin, Hsin-Chu (TW); Wen-Chou Wu, Hsin-Chu (TW); Hsing-Chih Liu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/535,019

(22) Filed: Aug. 7, 2019

(65) Prior Publication Data

US 2020/0058633 A1     Feb. 20, 2020

Related U.S. Application Data

(60) Provisional application No. 62/719,825, filed on Aug. 20, 2018.

(51) Int. Cl.
| | |
|---|---|
| *H01L 23/552* | (2006.01) |
| *H01L 23/31* | (2006.01) |
| *H01L 23/00* | (2006.01) |
| *H01L 25/18* | (2006.01) |

(52) U.S. Cl.
CPC ........ *H01L 23/552* (2013.01); *H01L 23/3128* (2013.01); *H01L 24/09* (2013.01); *H01L 24/17* (2013.01); *H01L 25/18* (2013.01); *H01L 2924/1421* (2013.01)

(58) Field of Classification Search
CPC .......... H01L 24/15; H01L 24/42; H01L 24/47
See application file for complete search history.

(56) References Cited

U.S. PATENT DOCUMENTS

| | | |
|---|---|---|
| 2009/0284947 A1 | 11/2009 | Beddingfield |
| 2012/0086109 A1 | 4/2012 | Kim |
| 2015/0333401 A1 | 11/2015 | Maruthamuthu |
| 2016/0293554 A1 | 10/2016 | Tan |
| 2017/0243858 A1 | 8/2017 | Chou |
| 2018/0076175 A1 | 3/2018 | Hsieh |
| 2018/0115051 A1 | 4/2018 | Nguyen |
| 2018/0166405 A1 | 6/2018 | Chiang |
| 2018/0261551 A1* | 9/2018 | Lee .................. H01L 24/17 |
| 2019/0131241 A1* | 5/2019 | Jeng ................ H01L 23/3114 |
| 2019/0181096 A1 | 6/2019 | Wu |

OTHER PUBLICATIONS

Seil Kim et al., Simulation-based Analysis on EMI Effect in LPDDR Interface for Mitigating RFI in a Mobile Environment, 2016, IEEE, XP032914971.

* cited by examiner

*Primary Examiner* — Cheung Lee
(74) *Attorney, Agent, or Firm* — Winston Hsu (57) ABSTRACT

The present disclosure provides a semiconductor package including a bottom package having a substrate, a radio-frequency (RF) die and a system-on-a-chip (SoC) die arranged on the substrate in a side-by-side manner, a molding compound covering the RF die and the SoC die, and an interposer over the molding compound. Connection elements and a column of signal interference shielding elements are disposed on the substrate. The connection elements surround the SoC die. The column of signal interference shielding elements is interposed between the RF die and the SoC die. A top package is mounted on the interposer.

14 Claims, 9 Drawing Sheets

SEMICONDUCTOR PACKAGE WITH REDUCED NOISE

CROSS REFERENCE TO RELATED APPLICATIONS

This application claims benefits from U.S. provisional application No. 62/719,825 filed Aug. 20, 2018, which is included herein in its entirety by reference.

BACKGROUND

The present disclosure relates generally to the field of semiconductor packaging. More particularly, the present disclosure relates to an improved package-on-package (PoP) package with reduced noise to satisfy de-sense requirement, which is suited for the 5G or automotive applications.

Semiconductor integrated circuit dies or chips are typically packaged for protection against an external environment. The package may provide physical protection, stability, external connections to the die inside the packages. In some cases, a DRAM package may be stacked on a bottom package so as to form a package-on-package (PoP) package.

However, the interposer substrate, which is disposed between the top package (i.e. DRAM package) and the bottom package, and the high-frequency interconnect traces and/or vias for communication with the DRAM chip, adversely affect the performance of the PoP package, especially when the bottom package comprises a vulnerable radio-frequency (RF) chip.

SUMMARY

It is one object to provide an improved Package-on-Package (PoP) package structure with reduced noise to satisfy de-sense requirement.

According to one embodiment, a semiconductor package includes a bottom package comprising a substrate, a radio-frequency (RF) die and a system-on-a-chip (SoC) die arranged on the substrate in a side-by-side manner, a molding compound covering the RF die and the SoC die, and an interposer over the molding compound.

Connection elements and a column of signal interference shielding elements are disposed on the substrate. The connection elements surround the SoC die. The column of signal interference shielding elements is interposed between the RF die and the SoC die. A top package is mounted on the interposer.

According to one embodiment, the top package is a memory package. According to one embodiment, the memory package is a dynamic random access memory (DRAM) package having at least one encapsulated DRAM die.

According to one embodiment, the RF die is a millimeter wave (mmw) intermediate-frequency (IF) RF die.

According to one embodiment, the plurality of connection elements comprise Cu/Sn balls, Cu pillars, Cu bumps, Cu vias, or through mold vias.

According to one embodiment, the plurality of connection elements and the column of signal interference shielding elements are surrounded by the molding compound.

According to one embodiment, the plurality of connection elements is coplanar with the column of signal interference shielding elements within the molding compound.

According to one embodiment, the interposer comprises re-routed traces and/or fan-out/fan-in pads that match with a ball map of the top package.

According to one embodiment, the interposer comprises a Si interposer.

According to one embodiment, the interposer comprises a re-distributed layer (RDL) interposer.

According to one embodiment, the SoC die comprises double data rate (DDR) interfaces arranged on an edge that is different from an edge of the SoC die that is adjacent to and directly faces the RF die.

According to one embodiment, the SoC die further comprises Camera Serial Interface (CSI) and/or Display Serial Interface.

According to one embodiment, the SoC die further comprises Universal Flash Storage (UFS) interface.

According to one embodiment, the SoC die further comprises analog baseband (ABB)/Serializer and Deserializer (SerDes) interface.

According to one embodiment, the SoC die further comprises universal serial bus (USB) interface.

According to one embodiment, the RF die is electrically coupled to a ground plane in the interposer that is physically separated from a DRAM ground plane.

According to one embodiment, the column of signal interference shielding elements are grounded elements.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

The present disclosure pertains to a semiconductor chip package with reduced noise (<noise threshold level) to satisfy de-sense requirement, which is suited for the 5G (fifth-generation of mobile communication) or automotive applications. According to some embodiments, the semiconductor chip package may be a Package-on-Package (PoP) package including a DRAM package (top package) stacked on a RF-SiP package (bottom package), but is not limited thereto. The electromagnetic interference to the RF chip or die in the bottom RF-SiP package can be alleviated and the in-package noise originated from the high-frequency digital transmissions can be reduced.

Figure 1:
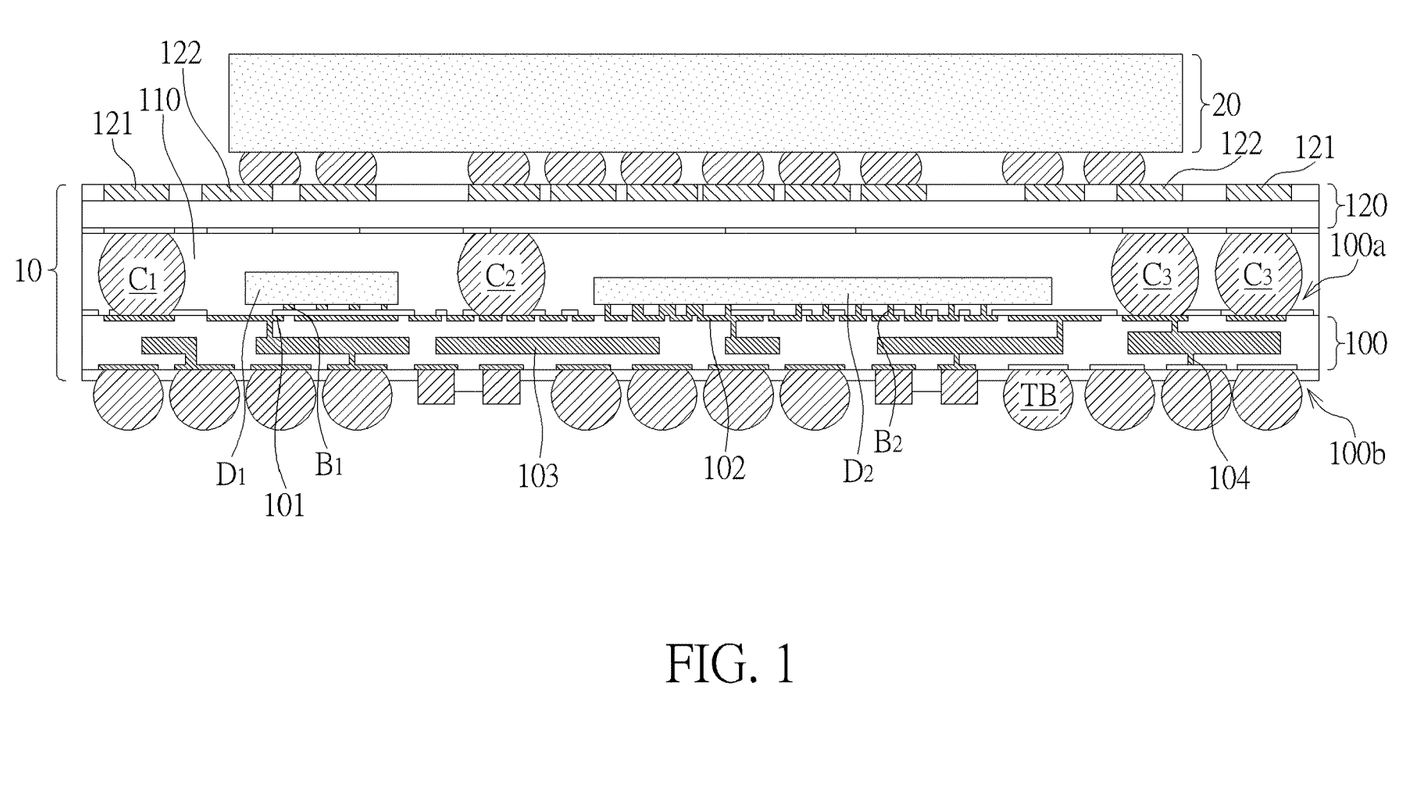
FIG. 1 is a schematic, cross-sectional diagram showing an exemplary PoP package according to one embodiment of the present invention.
Figure 2:
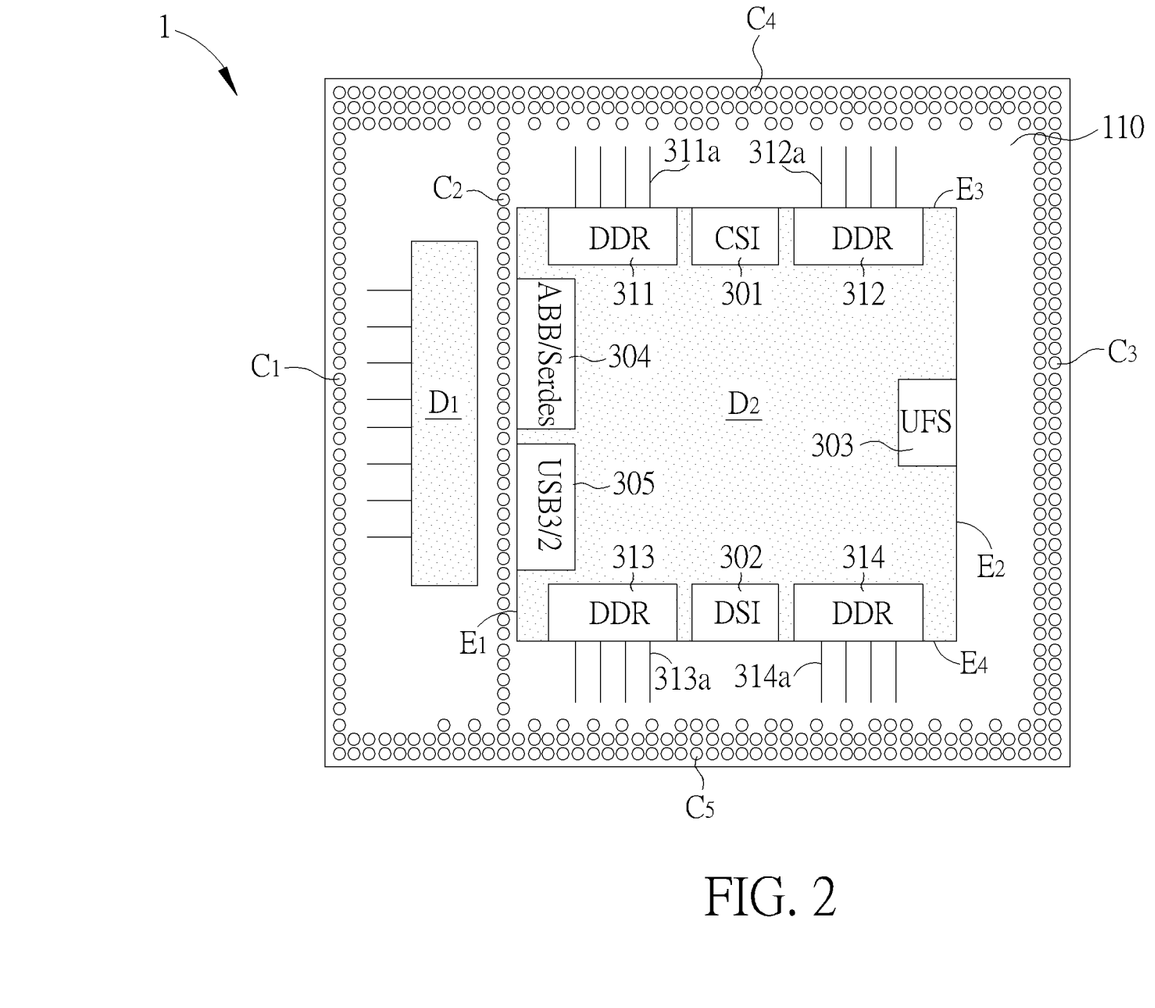
FIG. 2 is a perspective top view of the PoP package showing side-by-side arrangement of an RF die and a SoC die and the arrangement of the connection elements around the RF die and the SoC die in the bottom package of the exemplary PoP package in FIG. 1.

Please refer to FIG. 1 and FIG. 2. FIG. 1 is a schematic, cross-sectional diagram showing an exemplary PoP package according to one embodiment of the present invention. FIG. 2 is a perspective top view of the PoP package showing side-by-side arrangement of an RF die and a SoC (system-on-a-chip) die and the arrangement of the connection elements disposed around the RF die and the SoC die in the bottom package of the exemplary PoP package in FIG. 1.

As shown in FIG. 1, according to one exemplary embodiment, the PoP package 1 comprises a bottom package 10 and a top package 20 stacked on the bottom package 10. According to one exemplary embodiment, the top package 20 may be a memory package such as a dynamic random access memory (DRAM) package having at least one encapsulated DRAM die such as double data rate 4 (DDR4), low-power DDR4 (LPDDR4), DDR5, LPDDR5 or the like. According to one exemplary embodiment, the bottom package 10 may comprise a package substrate 100 having a top surface 100a and a bottom surface 100b. According to one exemplary embodiment, an RF die $D_1$ and a SoC die $D_2$ are mounted on the top surface 100a of the package substrate 100 in a side-by-side manner.

According to one exemplary embodiment, the package substrate 100 may be a multi-layer circuit board or a multi-layer wiring board. For example, the package substrate 100 may be a two-layer, three-layer, or four-layer circuit board, but is not limited thereto. According to one exemplary embodiment, the RF die $D_1$ and the SoC die $D_2$ may be flipped chips and may be boned to the package substrate 100 in a flip-chip manner.

For example, the bumps $B_1$ on an active surface of the RF die $D_1$ are electrically connected to corresponding bonding pads 101 on the top surface 100a of the package substrate 100. For example, an antenna (not shown) disposed in a printed circuit board or system board (not shown) may be electrically coupled to the RF die $D_1$ through the interconnect traces 103 and vias 104 in the package substrate 100 and the terminal balls TB disposed on the bottom surface 100b of the package substrate 100. For example, the bumps $B_2$ on an active surface of the SoC die $D_2$ are electrically connected to corresponding bonding pads 102 on the top surface 100a of the package substrate 100. For example, the signals from or to the SoC die $D_2$ may be transmitted through the interconnect traces 103 and vias 104 in the package substrate 100 and the terminal balls TB disposed on the bottom surface 100b of the package substrate 100.

According to one exemplary embodiment, the RF die $D_1$, the SoC die $D_2$ and the top surface 100a of the package substrate 100 are encapsulated by a molding compound 110. According to one exemplary embodiment, as shown in FIG. 1 and FIG. 2, a plurality of connection elements $C_1$~$C_5$ are disposed on the top surface 100a of the package substrate 100. For example, the connection elements $C_1$~$C_5$ may comprise Cu/Sn balls (Cu cored solder balls), Cu pillars, Cu bumps, Cu vias, through mold vias, or the like. According to one exemplary embodiment, the connection elements $C_1$~$C_5$ are surrounded by the molding compound 110. It is to be understood that the number of rows/columns of the connection elements $C_1$~$C_5$ in FIG. 2 is for illustration purposes only.

Figure 3:
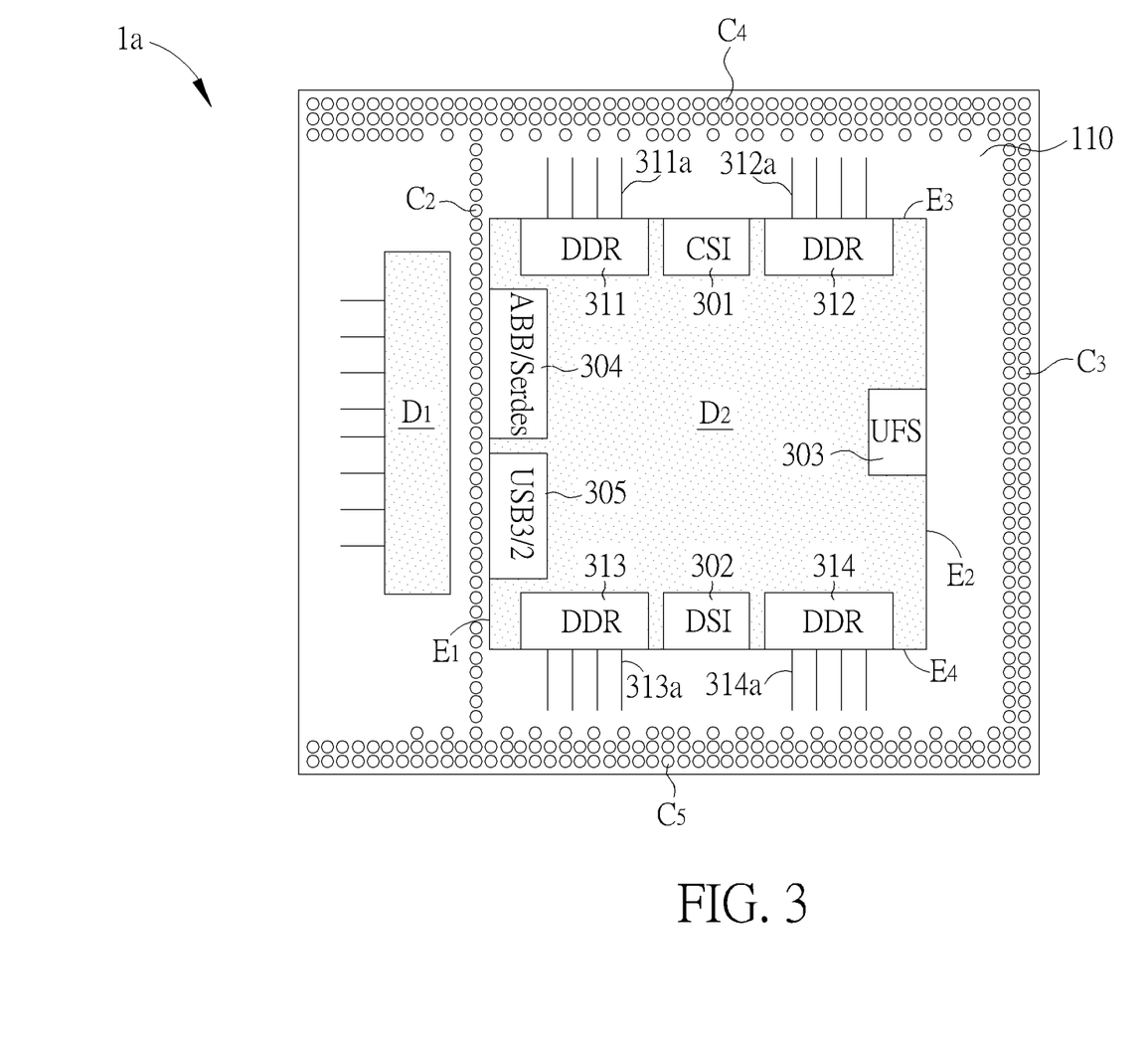
FIG. 3 is a perspective top view of the PoP package showing the arrangement of the connection elements around the RF die and a SoC die according to another embodiment of the present invention.

According to one exemplary embodiment, as shown in FIG. 2, when viewed from the above, the SoC die $D_2$ may have a rectangular shape and may have four edges $E_1$~$E_4$. The connection elements $C_1$, $C_2$, a portion of the connection elements $C_4$ and a portion of the connection elements $C_5$ are arranged around the RF die $D_1$. The connection elements $C_2$ and $C_3$, the rest of the connection elements $C_4$ and the rest of the connection elements $C_5$ are arranged around the SoC die $D_2$. According to one exemplary embodiment, at least the connection elements $C_2$ disposed directly between the edge $E_1$ of the SoC die $D_2$ and the RF die $D_1$ are grounded, which may act as shielding balls. According to one exemplary embodiment, the connection elements $C_1$, $C_2$ and some of the connection elements $C_3$ may be electrically coupled to ground. According to one exemplary embodiment, some of the connection elements $C_3$ may be electrically coupled to power. It is to be understood that the function of each of the connection elements C1~C5 may be designated according design requirements and layout design. In some embodiment, the connection elements near the central position of each row or column may be grounded. According to another embodiment, as shown in FIG. 3, the column of the connection elements $C_1$ may be omitted. Therefore, in FIG. 3, the PoP package 1a may comprise only connection elements $C_2$~$C_5$.

According to one exemplary embodiment, the connection elements $C_4$ and $C_5$ may be electrically coupled to the top package 20 through an interposer 120. The interposer 120 has re-routed traces 121 and/or fan-out/fan-in pads 122 that match with the ball map of the top package 20. The interposer 120 may comprise two or more than two metal layers such as copper layers. The interposer 120 may comprise laminate material. For example, the interposer 120 may comprise BT (Bismaleimide/Triazine) laminate material. In another embodiment, the interposer 120 may be a Si interposer and may comprise through silicon vias. It is to be understood that the structure of the interposer 120 shown in the figures is for illustration purposes only. In still another embodiment, the interposer 120 may be a re-distributed layer (RDL) interposer.

According to one exemplary embodiment, the RF die $D_1$ may be a millimeter wave (mmw) intermediate-frequency (IF) RF die, but is not limited thereto. According to one exemplary embodiment, the SoC die $D_2$ may be a 5G processor die, but is not limited thereto. For example, the SoC die $D_2$ may comprise interfaces such as Camera Serial Interface (CSI) 301 and/or Display Serial Interface (DSI) 302. These interfaces 301 and 302 are designed for high bandwidth video input (CSI) and output (DSI), which may be arranged on the edges $E_3$ and $E_4$, respectively. The SoC die $D_2$ may further comprise Universal Flash Storage (UFS) interface 303, which is a JEDEC standard for high performance mobile storage devices suitable for next generation data storage. According to a non-limiting, exemplary embodiment, the UFS interface 303 may be arranged on the edge $E_2$. The SoC die $D_2$ may further comprise ABB (analog baseband)/SerDes (Serializer and Deserializer) interface 304 and universal serial bus (USB) 2.0/3.0 interface 305, which may be arranged on the edge $E_1$. The SoC die $D_2$ may further comprise DDR interfaces 311~314, which are arranged on the edges $E_3$ and $E_4$, respectively.

It is noteworthy that the RF die $D_1$ is disposed adjacent to the edge $E_1$. Therefore, the DDR interfaces 311~314 are arranged on edges $E_3$ and $E_4$ that are different from the edge $E_1$ that is adjacent to and directly faces the RF die $D_1$. Preferably, the high-frequency digital signal traces 311a-314a in the package substrate 100, which are electrically coupled to the DDR interfaces 311~314 on the edges $E_3$ and $E_4$, respectively, do not intersect with the edge $E_1$ and do not overlap with the RF die $D_1$, when viewed from the above. In addition, the potential digital signal interference from the high-frequency digital signal traces 311a-314a can be blocked by the grounded connection elements $C_2$ disposed between the edge $E_1$ of the SoC die $D_2$ and the RF die $D_1$. The column of grounded connection elements $C_2$ (signal interference shielding elements) interposed between the RF die $D_1$ and the SoC die $D_2$ can effectively reduce noise.

Figure 4:
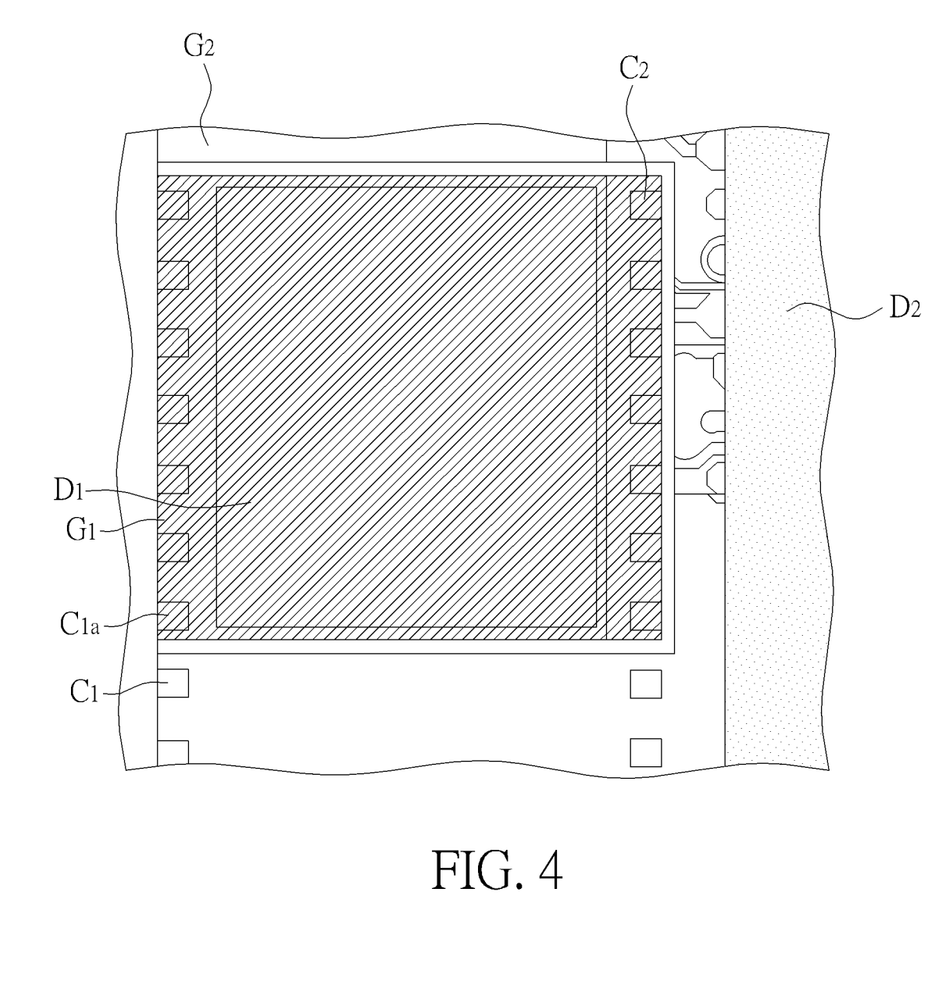
FIG. 4 is a schematic partial top view showing a separated ground plane configuration of the exemplary PoP package in FIG. 1.
Figure 5:
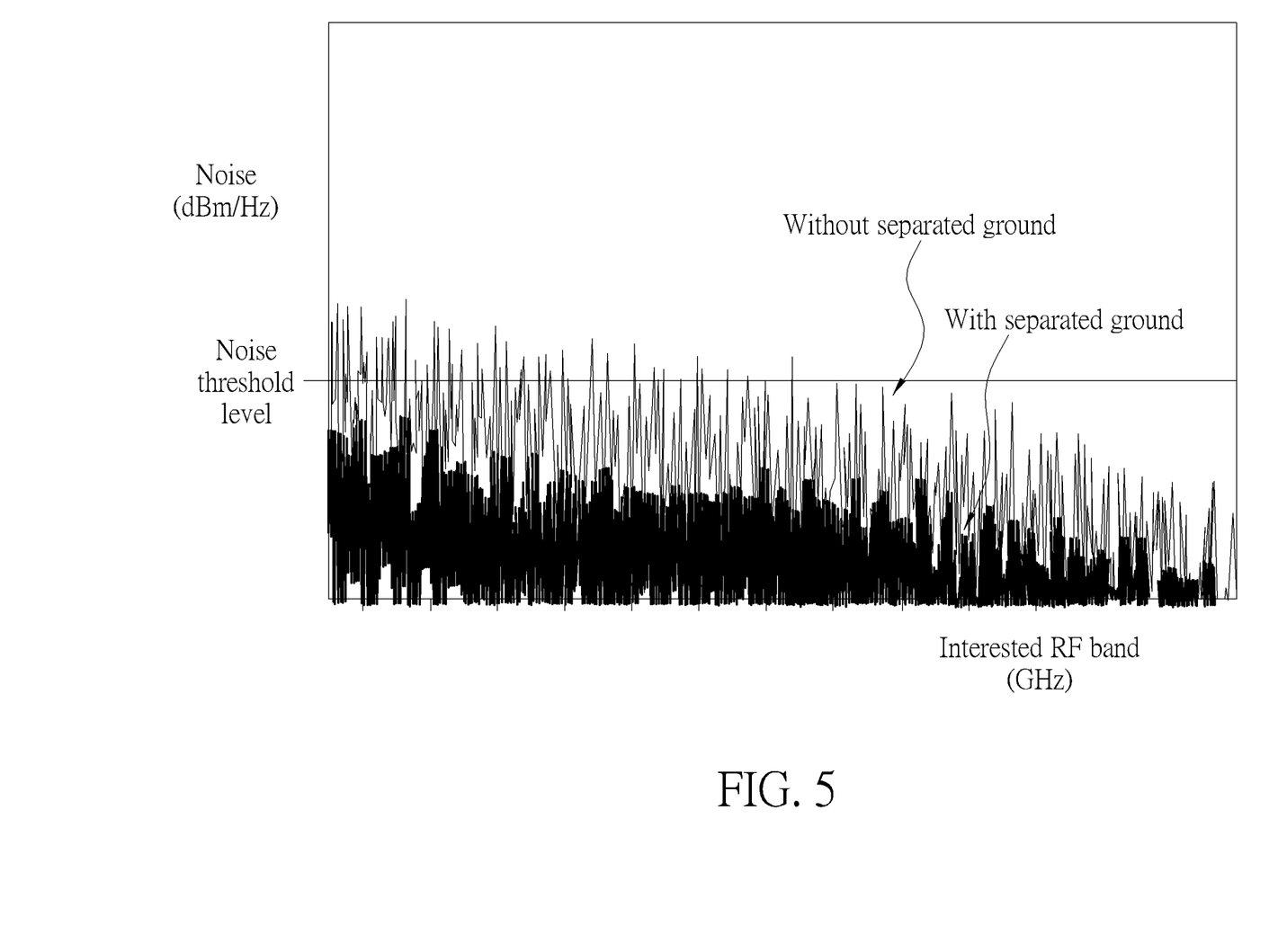
FIG. 5 is a plot showing noise vs. frequency relationship of the PoP package in FIG. 1 with or without separated ground.

Please refer to FIG. 4 and FIG. 5. FIG. 4 is a schematic partial top view showing a separated ground plane configuration of the exemplary PoP package in FIG. 1. FIG. 5 is a plot showing noise vs. frequency relationship of the PoP package in FIG. 1 with or without separated ground. As shown in FIG. 4, the ground plane $G_1$, which may be disposed in the interposer 120, is electrically coupled to connection elements $C_{1a}$ and is electrically coupled to the RF die $D_1$. The ground plane $G_1$ is separated from the DRAM ground plane $G_2$ in the interposer 120. By providing such configuration, the noise can be reduced to −170 dBm/Hz or even lower as shown in FIG. 5. In some embodiments, likewise, the package substrate 100 may have a separated ground plane for the RF die $D_1$.

Figure 6:
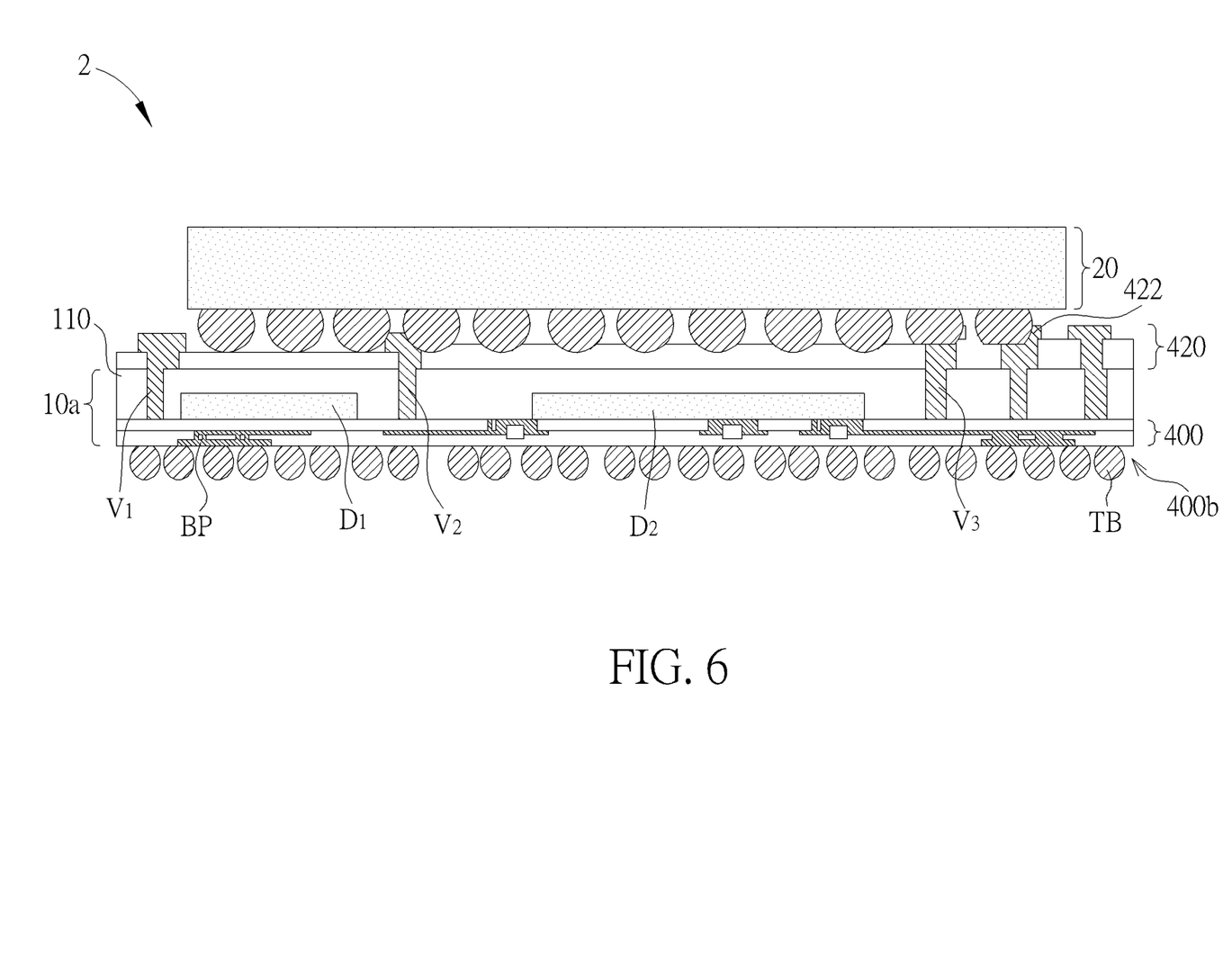
FIG. 6 is a schematic, cross-sectional diagram showing a PoP package according to another embodiment of the present invention.

FIG. 6 is a schematic, cross-sectional diagram showing a PoP package according to another embodiment of the present invention, wherein like numeral numbers designate like elements, regions or layers. As shown in FIG. 6, the PoP package 2 comprises a bottom package 10a and a top package 20 stacked on the bottom package 10a. The bottom package 10a may comprise a re-distribution layer (RDL) 400 and the input/output pads on the RF die $D_1$ and the SoC die $D_2$ can be re-distributed through the RDL 400 to form bonding pads BP on the lower surface 400b of the RDL 400. Terminal balls TB such as ball grid array (BGA) balls are mounted on the respective bonding pads BP. Likewise, the RF die $D_1$ and the SoC die $D_2$ are encapsulated by the molding compound 110 and copper vias $V_1$~$V_3$ may be formed in the molding compound 110, which are electrically connected to over-mold RDL 420. The bonding pads 422 for the top package 20 is formed in the over-mold RDL 420. The top package 20 such as LPDDR4 or LPDDR5 DRAM package may be electrically connected to the DDR interface of the SoC die $D_2$ through the over-mold RDL 420, the copper vias $V_1$~$V_3$, and the RDL 400. The layout of the copper vias $V_2$ is similar to the connection elements $C_2$ as shown in FIG. 2 or FIG. 3. The grounded copper vias $V_2$ may function as shielding elements that can block the potential digital signal interference from the high-frequency digital signals.

Figure 7:
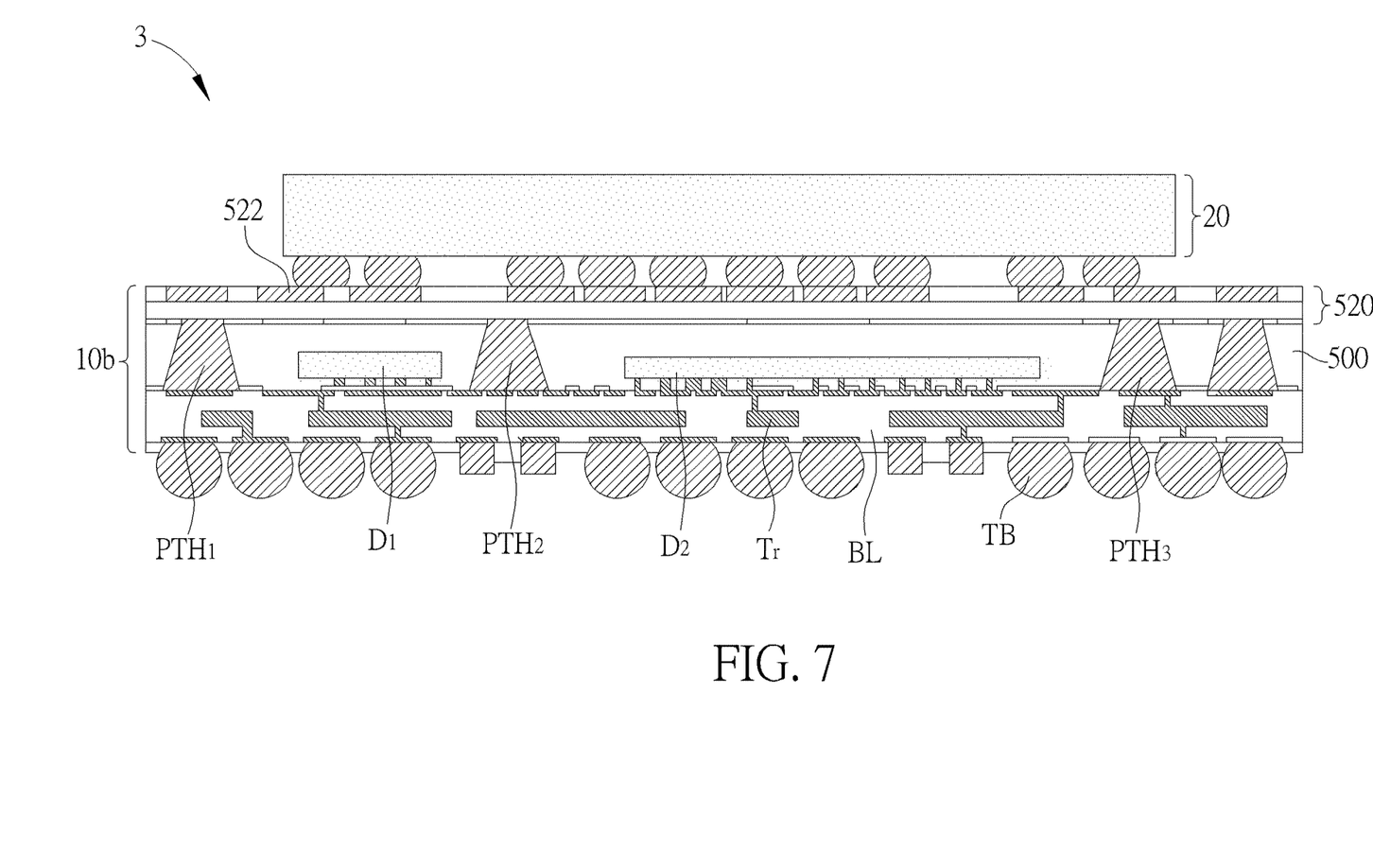
FIG. 7 is a schematic, cross-sectional diagram showing a PoP package according to still another embodiment of the present invention.

FIG. 7 is a schematic, cross-sectional diagram showing a PoP package according to still another embodiment of the present invention, wherein like numeral numbers designate like elements, regions or layers. As shown in FIG. 7, likewise, the PoP package 3 comprises a bottom package 10b and a top package 20 stacked on the bottom package 10b. The bottom package 10b may be an embedded die package. The RF die $D_1$ and the SoC die $D_2$ are embedded in the substrate and are interconnected through substrate processes so as to form a system-in-board package. For example, the RF die $D_1$ and the SoC die $D_2$ may be embedded in a core substrate 500. The core substrate 500 may comprise copper clad laminate (CCL) substrates or organic laminate substrates known in the art. Build-up layers BL and interconnect structures Tr such as high-density interconnect (HDI) traces and laser-drilled vias may be formed on the core substrate 500. Through vias $PTH_1 \sim PTH_3$ may be formed in the core substrate 500 of the bottom package 10b and may be electrically coupled to the circuit layer 520. The bonding pads 522 for the top package 20 may be formed in the circuit layer 520. The top package 20 such as LPDDR4 or LPDDR5 DRAM package may be electrically connected to the DDR interface of the SoC die $D_2$ through the circuit layer 520, the through vias $PTH_1 \sim PTH_3$, and the interconnect structures Tr of the substrate 500. The layout of the through vias $PTH_2$ is similar to the connection elements $C_2$ as shown in FIG. 2 or FIG. 3. The grounded through vias $PTH_2$ may function as shielding elements that can block the potential digital signal interference from the high-frequency digital signals.

Figure 8:
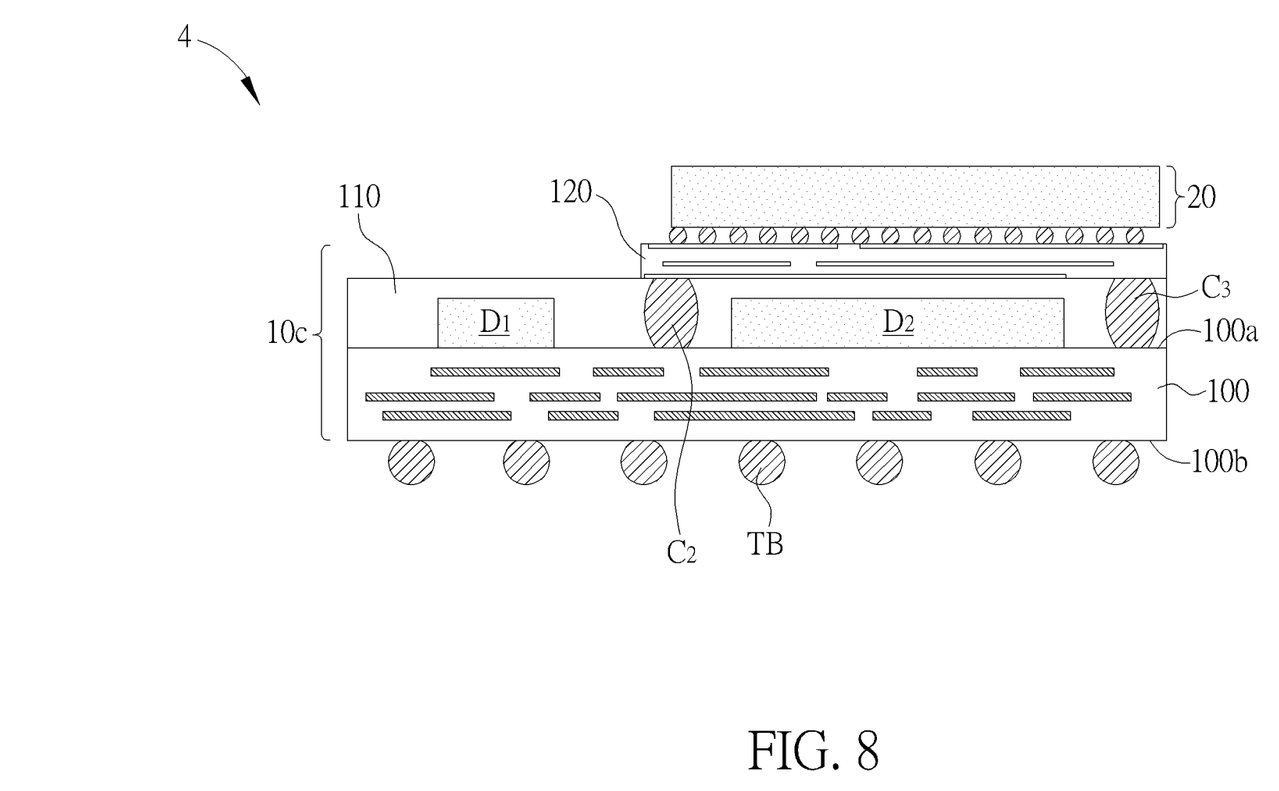
FIG. 8 is a schematic, cross-sectional diagram showing a PoP package according to yet another embodiment of the present invention.
Figure 9:
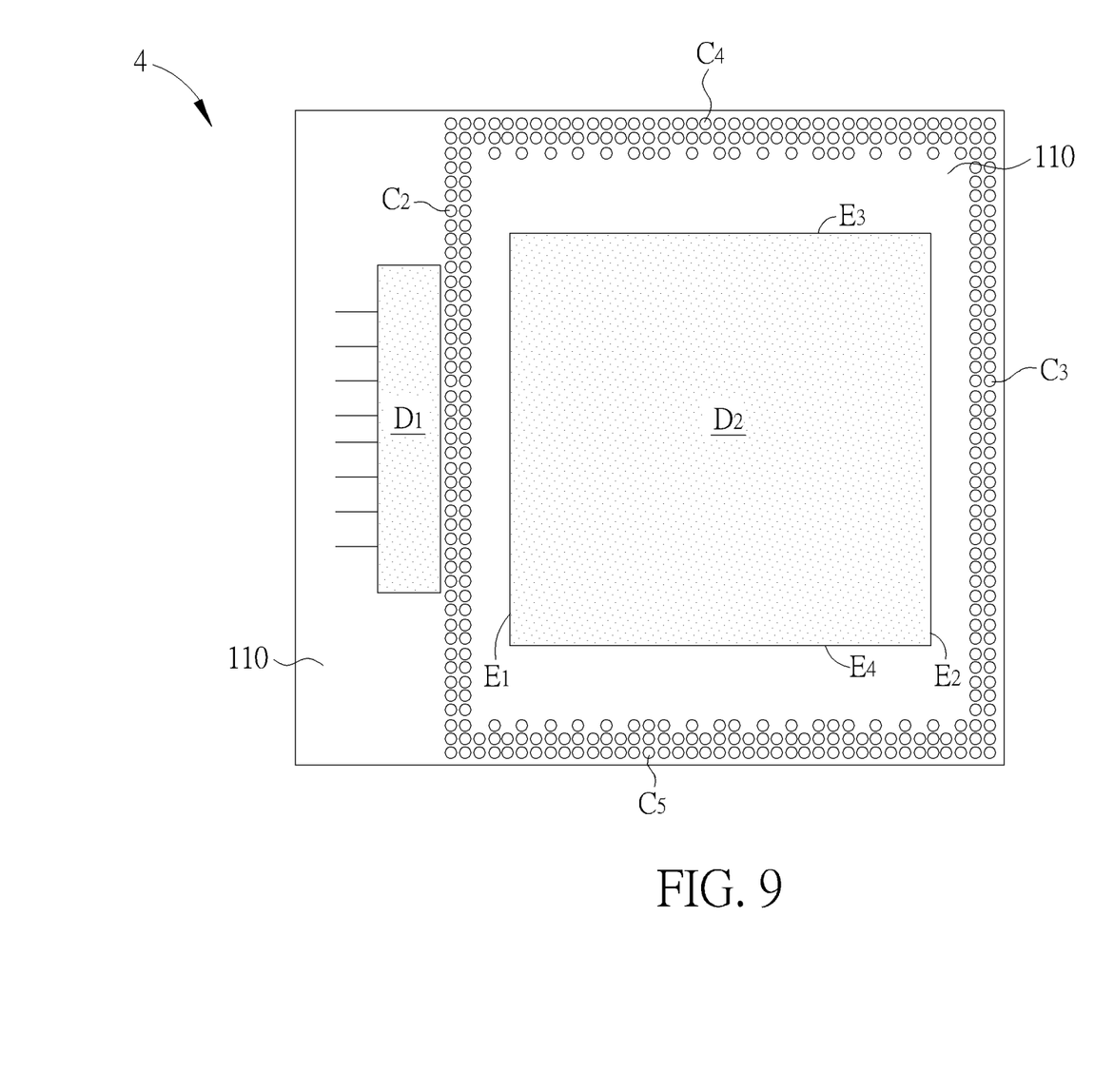
FIG. 9 is a perspective top view of the PoP package showing side-by-side arrangement of the RF die and the SoC die and the arrangement of the connection elements disposed around the RF die and the SoC die in the bottom package of the exemplary PoP package in FIG. 8.

Please refer to FIG. 8 and FIG. 9. FIG. 8 is a schematic, cross-sectional diagram showing a PoP package according to yet another embodiment of the present invention. FIG. 9 is a perspective top view of the PoP package showing side-by-side arrangement of the RF die and the SoC die and the arrangement of the connection elements disposed around the RF die and the SoC die in the bottom package of the exemplary PoP package in FIG. 8.

As shown in FIG. 8, the PoP package 4 comprises a bottom package 10c and a top package 20 stacked on the bottom package 10c. According to one exemplary embodiment, the top package 20 may be a memory package such as a DRAM package having at least one encapsulated DRAM die such as DDR4, LPDDR4, DDR5, LPDDR5 or the like. According to one exemplary embodiment, the bottom package 10c may comprise a package substrate 100 having a top surface 100a and a bottom surface 100b. According to one exemplary embodiment, an RF die $D_1$ and a SoC die $D_2$ are mounted on the top surface 100a of the package substrate 100 in a side-by-side manner.

According to one exemplary embodiment, likewise, the package substrate 100 may be a multi-layer circuit board or a multi-layer wiring board. For example, the package substrate 100 may be a two-layer, three-layer, or four-layer circuit board, but is not limited thereto. According to one exemplary embodiment, the RF die $D_1$ and the SoC die $D_2$ may be flipped chips and may be boned to the package substrate 100 in a flip-chip manner.

According to one exemplary embodiment, the RF die $D_1$, the SoC die $D_2$ and the top surface 100a of the package substrate 100 are encapsulated by a molding compound 110. According to one exemplary embodiment, as shown in FIG. 8 and FIG. 9, a plurality of connection elements $C_2 \sim C_5$ are disposed on the top surface 100a of the package substrate 100. For example, the connection elements $C_2 \sim C_5$ may comprise Cu/Sn balls (Cu cored solder balls), Cu pillars, Cu bumps, Cu vias, through mold vias, or the like. According to one exemplary embodiment, the connection elements $C_2 \sim C_5$ are surrounded by the molding compound 110. According to one exemplary embodiment, the connection elements $C_2 \sim C_5$ may be electrically coupled to the top package 20 through an interposer 120. The interposer 120 has re-routed traces and/or fan-out/fan-in pads that match with the ball map of the top package 20. The interposer 120 may comprise two or more than two metal layers such as copper layers. The interposer 120 may comprise laminate material. For example, the interposer 120 may comprise BT (Bismaleimide/Triazine) laminate material. In another embodiment, the interposer 120 may be a Si interposer and may comprise through silicon vias. It is to be understood that the structure of the interposer 120 shown in the figures is for illustration purposes only.

The size of the package substrate 100 is greater than the overlying interposer 120. Therefore, only the SoC die $D_2$ is completely surrounded by the connection elements $C_2 \sim C_5$. In addition, only the SoC die $D_2$ is overlapped with the interposer 120. The high-frequency digital signal traces in the package substrate 100, which are electrically coupled to the DDR interfaces on the edges $E_3$ and $E_4$, respectively, do not intersect with the edge $E_1$ and do not overlap with the RF die $D_1$. The grounded connection elements $C_2$ may function as shielding elements that can block the potential digital signal interference from the high-frequency digital signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a bottom package comprising a substrate, an radio-frequency (RF) die and a system-on-a-chip (SoC) die arranged on said substrate in a side-by-side manner, a molding compound covering said RF die and said SoC die, and an interposer over said molding compound;
   a plurality of connection elements disposed on a top surface of said substrate, wherein said plurality of connection elements surrounds said SoC die;
   a column of signal interference shielding elements interposed between said RF die and said SoC die; and
   a top package mounted on the interposer, wherein said SoC die comprises double data rate (DDR) interfaces arranged on an edge that is different from an edge of said SoC die that is adjacent to and directly faces said RF die.

2. The semiconductor package according to claim 1, wherein said top package is a memory package.

3. The semiconductor package according to claim 2, wherein said memory package is a dynamic random access memory (DRAM) package having at least one encapsulated DRAM die.

4. The semiconductor package according to claim 1, wherein said RF die is a millimeter wave (mmw) intermediate-frequency (IF) RF die.

5. The semiconductor package according to claim 1, wherein said plurality of connection elements comprise Cu/Sn balls, Cu pillars, Cu bumps, Cu vias, or through mold vias.

6. The semiconductor package according to claim 1, wherein said plurality of connection elements and said column of signal interference shielding elements are surrounded by the molding compound.

7. The semiconductor package according to claim 6, wherein said plurality of connection elements is coplanar with said column of signal interference shielding elements within said molding compound.

8. The semiconductor package according to claim 1, wherein said interposer comprises re-routed traces and/or fan-out/fan-in pads that match with a ball map of said top package.

9. The semiconductor package according to claim 1, wherein said interposer comprises a Si interposer.

10. The semiconductor package according to claim 1, wherein said interposer comprises a re-distributed layer (RDL) interposer.

11. The semiconductor package according to claim 1, wherein said RF die is electrically coupled to a ground plane in the interposer that is physically separated from a DRAM ground plane.

12. The semiconductor package according to claim 1, wherein said column of signal interference shielding elements are grounded elements.

13. A semiconductor package, comprising:
a bottom package comprising a substrate, an radio-frequency (RF) die and a system-on-a-chip (SoC) die arranged on said substrate in a side-by-side manner, a molding compound covering said RF die and said SoC die, and an interposer over said molding compound;
a plurality of connection elements disposed on a top surface of said substrate, wherein said plurality of connection elements surrounds said SoC die;
a column of signal interference shielding elements interposed between said RF die and said SoC die, wherein the signal interference shielding elements are coupled to ground; and
a top package mounted on the interposer, wherein said SoC die comprises double data rate (DDR) interfaces arranged on an edge that is different from an edge of said SoC die that is adjacent to and directly faces said RF die.

14. A semiconductor package, comprising:
a bottom package comprising a substrate, an radio-frequency (RF) die and a system-on-a-chip (SoC) die arranged on said substrate in a side-by-side manner, a molding compound covering said RF die and said SoC die, and an interposer over said molding compound;
a plurality of connection elements disposed on a top surface of said substrate, wherein said plurality of connection elements surrounds said SoC die;
a column of signal interference shielding elements interposed between said RF die and said SoC die, wherein said RF die is electrically coupled to a ground plane in the interposer that is physically separated from a DRAM ground plane; and
a top package mounted on the interposer.

* * * * *